United States Patent
Kaneko et al.

(10) Patent No.: US 10,535,678 B1
(45) Date of Patent: Jan. 14, 2020

(54) SEMICONDUCTOR MEMORY DEVICE

(71) Applicant: TOSHIBA MEMORY CORPORATION, Minato-ku (JP)

(72) Inventors: Hajime Kaneko, Yokkaichi (JP);
Takuya Inatsuka, Yokkaichi (JP);
Hideki Inokuma, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/129,101

(22) Filed: Sep. 12, 2018

(30) Foreign Application Priority Data

Jun. 21, 2018 (JP) ................... 2018-118054

(51) Int. Cl.
*H01L 27/1157* (2017.01)
*H01L 27/11582* (2017.01)
*H01L 27/11573* (2017.01)
*H01L 27/11524* (2017.01)

(52) U.S. Cl.
CPC .... *H01L 27/11582* (2013.01); *H01L 27/1157* (2013.01); *H01L 27/11524* (2013.01); *H01L 27/11573* (2013.01)

(58) Field of Classification Search
CPC ...................................................... H01L 29/68
See application file for complete search history.

(56) References Cited

U.S. PATENT DOCUMENTS

| | | |
|---|---|---|
| 8,013,383 B2 | 9/2011 | Kidoh et al. |
| 8,791,523 B2 | 7/2014 | Iino et al. |
| 9,099,349 B2 | 8/2015 | Kofuji et al. |
| 2013/0228843 A1 | 9/2013 | Lim et al. |
| 2015/0115350 A1 | 4/2015 | Maejima |

FOREIGN PATENT DOCUMENTS

| | | |
|---|---|---|
| JP | 2009-200443 | 9/2009 |
| JP | 2013-55136 | 3/2013 |
| JP | 2013-183158 | 9/2013 |
| JP | 5283960 | 9/2013 |
| JP | 2014-127475 | 7/2014 |

*Primary Examiner* — Cheung Lee
(74) *Attorney, Agent, or Firm* — Oblon, McClelland, Maier & Neustadt, L.L.P.

(57) ABSTRACT

A semiconductor memory device includes a first member spreading along a first direction and a second direction, a stacked body provided on a third-direction side when viewed from the first member, and a second member provided inside the first member and exposed at a surface of the first member on the third-direction side. A configuration of an end portion in the first direction of the stacked body is a staircase configuration having terraces formed every conductive film. The second member is made from a material different from a material of the first member. The second member is totally disposed in a region opposing a total length of an end edge of the stacked body on the first-direction side, and not disposed in an outer region of the stacked body on the second-direction side.

19 Claims, 14 Drawing Sheets

US 10,535,678 B1

SEMICONDUCTOR MEMORY DEVICE

CROSS-REFERENCE TO RELATED APPLICATIONS

This application is based upon and claims the benefit of priority from Japanese Patent Application No. 2018-118054, filed on Jun. 21, 2018; the entire contents of which are incorporated herein by reference.

FIELD

Embodiments relate to a semiconductor memory device.

BACKGROUND

In recent years, a stacked semiconductor memory device has been proposed in which electrode films are stacked. In such a semiconductor memory device, the end portion of the stacked body in which the electrode films are stacked is patterned into a staircase configuration in which terraces are formed every electrode film to connect contacts respectively to the electrode films. However, there are cases where the positions of the terraces are shifted from the design positions after the patterning.

DETAILED DESCRIPTION

A semiconductor memory device according to one embodiment includes a first member spreading along a first direction and a second direction, a stacked body provided on a third-direction side when viewed from the first member, a semiconductor member extending in the third direction and piercing the stacked body, a charge storage member, and a second member provided inside the first member and being made from a material different from a material of the first member. The second direction crosses the first direction. The third direction crosses the first direction and the second direction. The stacked body includes a plurality of conductive films extending in the first direction and being arranged to be separated from each other along the second direction and the third direction. The charge storage member is provided between the semiconductor member and one of the plurality of conductive films. A configuration of an end portion in the first direction of the stacked body is a staircase configuration having terraces formed every conductive film. The second member is exposed at a surface of the first member on the third-direction side further on an outer side than the end portion in the first direction of the stacked body. The second member is totally disposed in a region opposing a total length of an end edge of the stacked body on the first-direction side. The second member is not disposed in an outer region of the stacked body on the second-direction side.

First Embodiment

A first embodiment will now be described.

Figure 1:
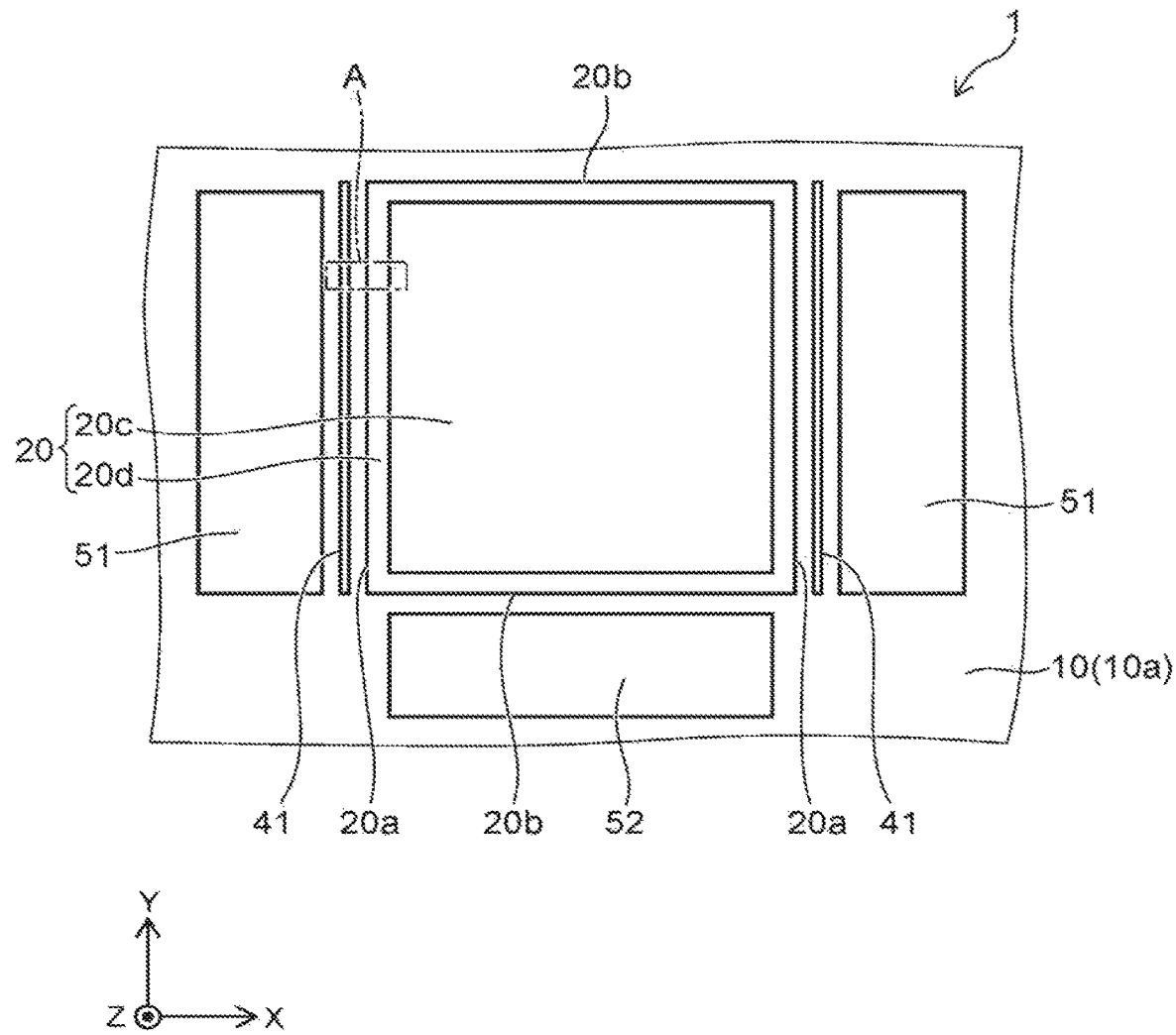
FIG. 1 is a plan view showing a semiconductor memory device according to a first embodiment.

FIG. 1 is a plan view showing a semiconductor memory device according to the embodiment.

Figure 2:
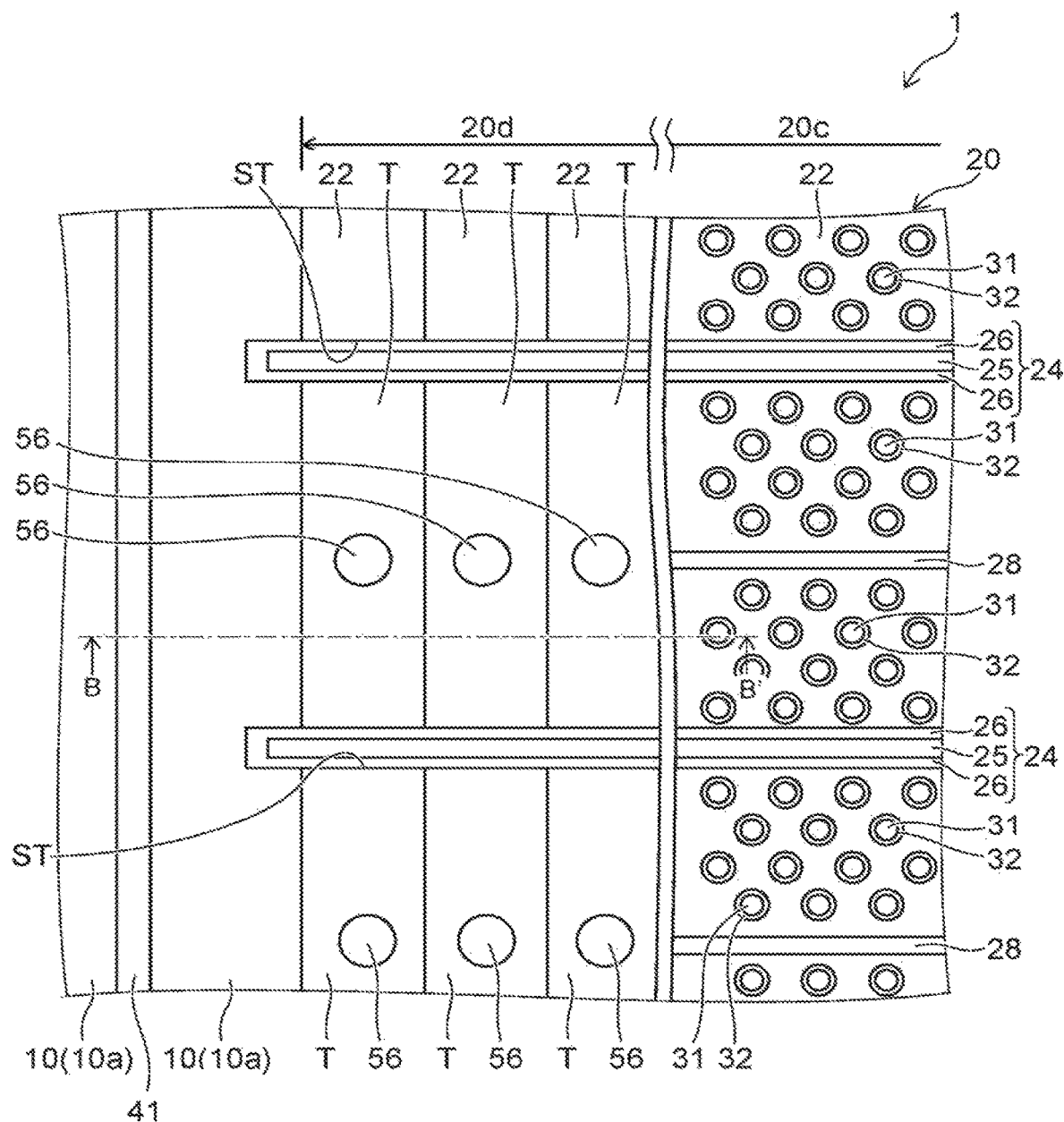
FIG. 2 is a plan view showing region A of FIG. 1.

FIG. 2 is a plan view showing region A of FIG. 1.

Figure 3:
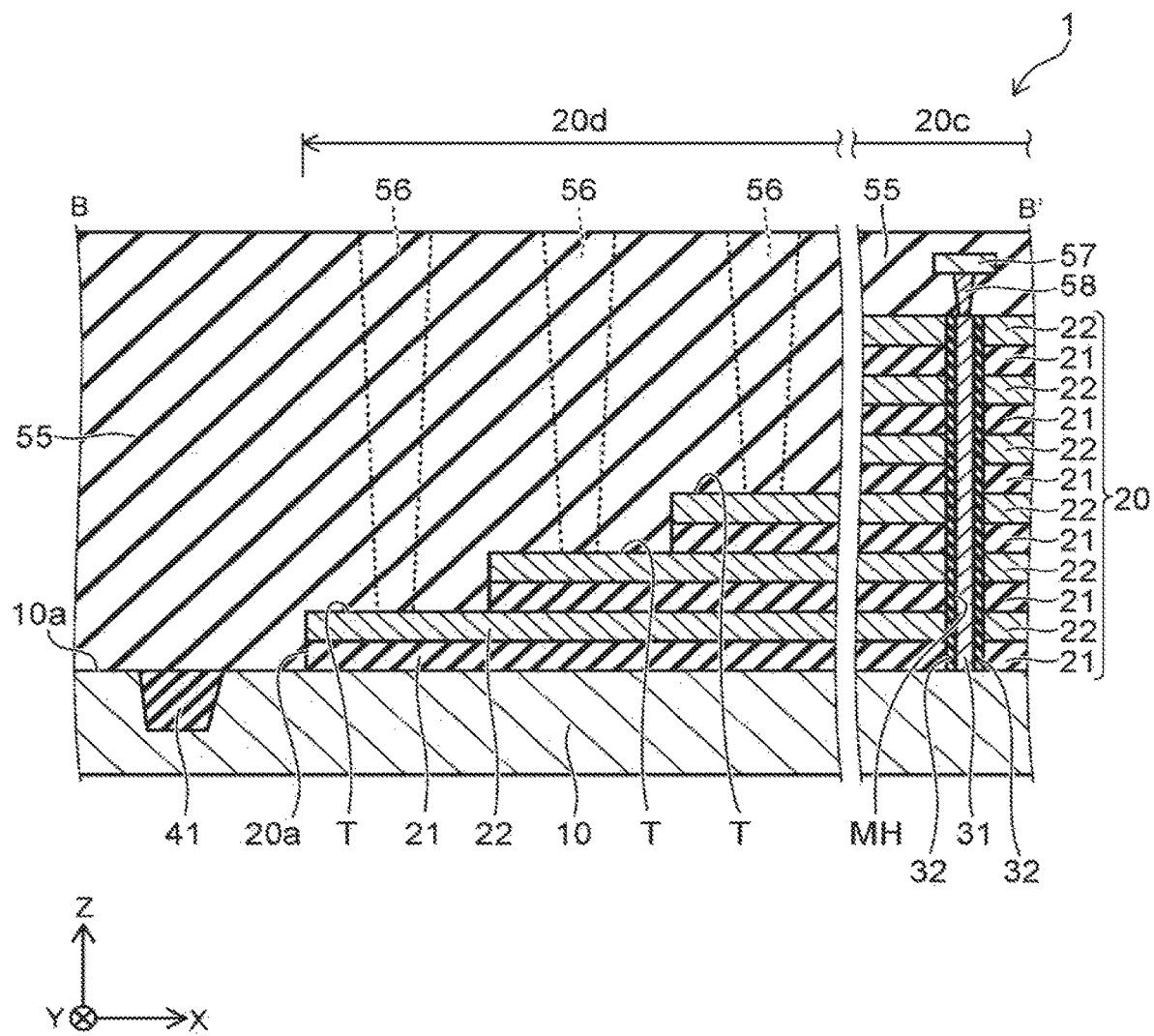
FIG. 3 is a cross-sectional view along line B-B' shown in FIG. 2.

FIG. 3 is a cross-sectional view along line B-B' shown in FIG. 2.

Figure 4:
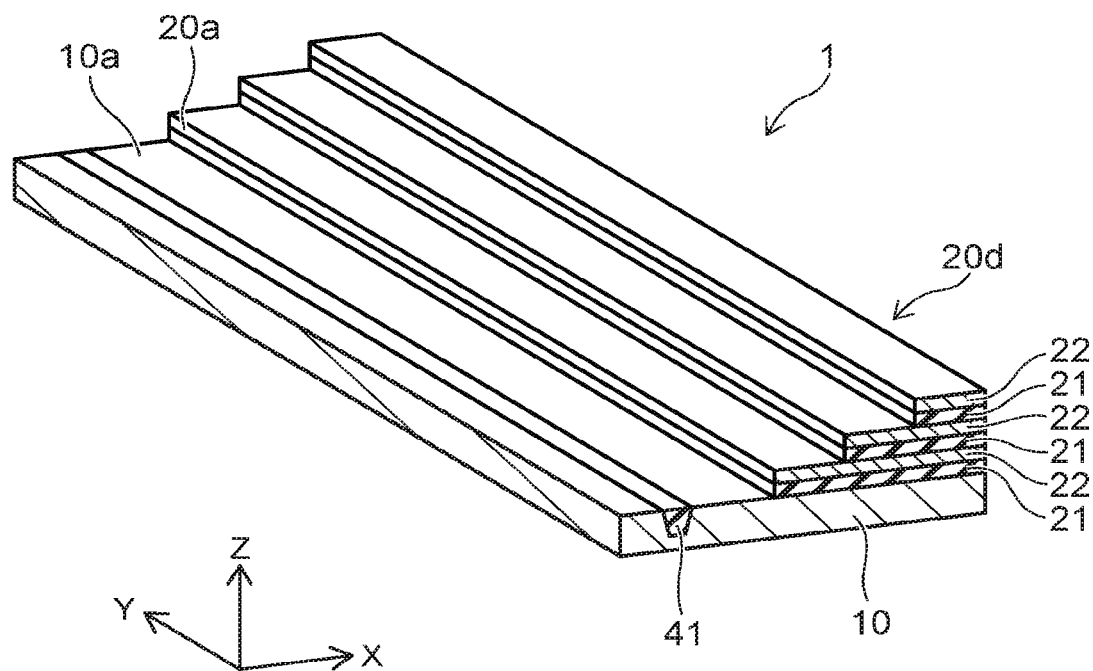
FIG. 4 is a perspective view showing the semiconductor memory device according to the first embodiment.

FIG. 4 is a perspective view showing the semiconductor memory device according to the embodiment.

The drawings are schematic and are drawn with appropriate exaggerations or omissions. For example, the components are drawn to be larger and fewer than the actual components. The numbers, dimensional ratios, etc., of the components do not always match between the drawings.

The semiconductor memory device according to the embodiment is stacked NAND flash memory.

As shown in FIG. 1, a silicon substrate 10 is provided in the semiconductor memory device 1 according to the embodiment. For example, the silicon substrate 10 is formed of single-crystal silicon (Si). A stacked body 20 is provided on the silicon substrate 10.

In the specification hereinbelow, an XYZ orthogonal coordinate system is employed for convenience of description. Two mutually-orthogonal directions parallel to the upper surface 10a of the silicon substrate 10 are taken as an "X-direction" and a "Y-direction." The silicon substrate 10 is a semiconductor member having a plate configuration spreading along the X-direction and the Y-direction. A direction orthogonal to the upper surface 10a is taken as a "Z-direction." Although a direction that is in the Z-direction from the silicon substrate 10 toward the stacked body 20 also is called "up" and the reverse direction also is called "down," these expressions are for convenience.

When viewed from the Z-direction, the configuration of the stacked body 20 is a rectangle; and a pair of end edges 20a of the stacked body 20 is the end edges of the stacked body 20 on the X-direction sides and extends in the Y-direction. Another pair of end edges 20b is the end edges of the stacked body 20 on the Y-direction sides and extends in the X-direction. In the stacked body 20, a central portion 20c is provided; and an end portion 20d is provided at the periphery of the central portion 20c.

When viewed from the stacked body 20, peripheral circuit regions 51 are set on the two X-direction sides. Peripheral circuits (not illustrated) are formed in the peripheral circuit regions 51. When viewed from the stacked body 20, a sense amplifier region 52 is set on one Y-direction side. Sense amplifiers (not illustrated) are formed in the sense amplifier region 52.

When viewed from the Z-direction, mark members 41 are provided between the stacked body 20 and the peripheral circuit regions 51, that is, on the two X-direction sides of the stacked body 20. The mark members 41 extend to be continuous along the Y-direction and are totally disposed in regions opposing the total lengths of the end edges 20a of the stacked body 20. On the other hand, the mark members 41 are not provided in outer regions of the stacked body 20 on the Y-direction sides.

As shown in FIG. 3 and FIG. 4, the mark member 41 is filled into the upper layer portion of the silicon substrate 10 and is exposed at the upper surface 10a of the silicon substrate 10 further on the outer side than the end portion 20d of the stacked body 20 on the X-direction side. Also, the mark member 41 does not pierce through the silicon substrate 10. The mark member 41 is made from a material different from the material of the silicon substrate 10, i.e., silicon, and is made of, for example, silicon oxide (SiO). The distance between the stacked body 20 and the mark member 41 is, for example, 10 µm or less.

As shown in FIG. 2 and FIG. 3, insulating films 21 that are made of, for example, silicon oxide and electrode films 22 that are made of, for example, tungsten (W) are stacked alternately along the Z-direction in the stacked body 20. The configuration of the end portion 20d of the stacked body 20 is a staircase configuration in which terraces T are formed every electrode film 22.

A plate member 24 that spreads along the XZ plane is provided inside the stacked body 20. A conductive plate 25 that is made of a conductive material such as, for example, tungsten, polysilicon, etc., and an insulating plate 26 that is made of an insulating material such as, for example, silicon oxide, etc., are provided in the plate member 24. The insulating plate 26 is disposed on the two X-direction sides and the two Y-direction sides of the conductive plate 25 and surrounds the conductive plate 25 when viewed from the Z-direction. Therefore, the conductive plate 25 is insulated from the electrode films 22 by the insulating plate 26. The lower end of the conductive plate 25 contacts the silicon substrate 10.

The electrode films 22 are divided along the Y-direction by the plate members 24. Therefore, the configuration of each of the electrode films 22 is a band configuration that extends in the X-direction and is partitioned by the insulating films 21 and the plate members 24. The multiple electrode films 22 that are included in the stacked body 20 are arranged in a matrix configuration and are separated from each other along the Y-direction and the Z-direction.

An insulating member 28 that is made of, for example, silicon oxide is provided inside the central portion 20c of the stacked body 20. The configuration of the insulating member 28 is a band configuration extending in the X-direction. The insulating member 28 divides one or multiple electrode films 22 from the uppermost layer. For example, the insulating member 28 is disposed between two plate members 24 adjacent to each other in the Y-direction.

A silicon pillar 31 is provided as a semiconductor member inside the central portion 20c of the stacked body 20. The silicon pillar 31 is made of, for example, polysilicon, extends in the Z-direction, and pierces the central portion 20c of the stacked body 20. In other words, the silicon pillar 31 pierces the multiple electrode films 22 arranged along the Z-direction; and the lower end of the silicon pillar 31 is connected to the silicon substrate 10. A core member (not illustrated) that is made of, for example, silicon oxide may be provided in the interior of the silicon pillar 31.

A charge storage film 32 is provided at the periphery of the silicon pillar 31. The charge storage film 32 is a film that can store charge, is made from a material that has trap sites of, for example, electrons, and is made of, for example, silicon nitride (SiN). The configuration of the charge storage film 32 is, for example, a tubular configuration having the Z-direction as the axis direction. Therefore, a portion of the charge storage film 32 is disposed between the silicon pillar 31 and the electrode films 22.

A tunneling insulating film (not illustrated) is provided between the silicon pillar 31 and the charge storage film 32. Although the tunneling insulating film normally is insulative, the tunneling insulating film is a film in which a tunneling current flows when a prescribed voltage within the range of the drive voltage of the semiconductor memory device 1 is applied and is, for example, a single-layer silicon oxide film or an ONO film in which a silicon oxide layer, a silicon nitride layer, and a silicon oxide layer are stacked in this order.

A blocking insulating film (not illustrated) is provided between the charge storage film 32 and the electrode films 22. The blocking insulating film is a film in which a current substantially does not flow even when a voltage within the range of the drive voltage of the semiconductor memory device 1 is applied. For example, a silicon oxide layer and an aluminum oxide layer are stacked in the blocking insulating film.

An inter-layer insulating film 55 that is made of, for example, silicon oxide is provided on the silicon substrate 10. The inter-layer insulating film 55 also covers the stacked body 20. A contact 56 is provided inside the inter-layer insulating film 55. The contact 56 extends in the Z-direction; and the lower end of the contact 56 is connected to the electrode film 22 at the terrace T.

A bit line 57 that extends in the Y-direction is provided inside the inter-layer insulating film 55 on the stacked body 20. The bit line 57 is connected to the upper end of the silicon pillar 31 via a plug 58. The inter-layer insulating film 55, the bit line 57, and the plug 58 are not illustrated in FIG. 1, FIG. 2, and FIG. 4.

A method for manufacturing the semiconductor memory device 1 according to the embodiment will now be described.

Figure 5:
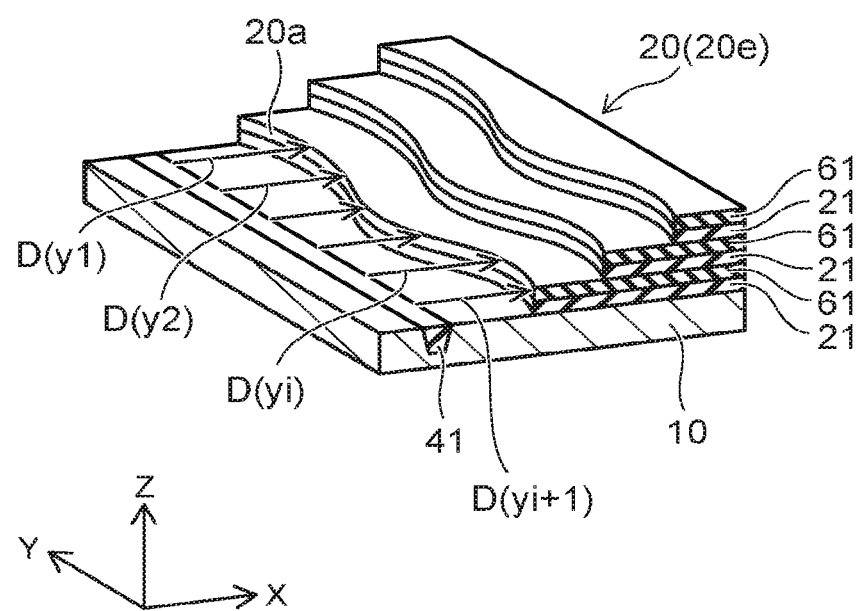
FIG. 5 is a perspective view showing a method for manufacturing the semiconductor memory device according to the first embodiment.

FIG. 5 is a perspective view showing the method for manufacturing the semiconductor memory device according to the embodiment.

First, in the silicon substrate 10 as shown in FIG. 1, the structure bodies that are disposed inside the silicon substrate are formed for the peripheral circuits formed in the peripheral circuit regions 51; and the structure bodies that are disposed inside the silicon substrate 10 are formed for the sense amplifiers formed in the sense amplifier region 52. At this time, the mark members 41 that extend in the Y-direction are formed on the outer sides of the two X-direction sides of the region where the stacked body 20 is to be formed by utilizing a process that forms STI (Shallow Trench Isolation (element-separating insulating films)) inside the peripheral circuit regions 51 and inside the sense amplifier region 52. Then, the structure bodies of the peripheral circuits disposed on the silicon substrate 10 are formed; and the structure bodies of the sense amplifiers disposed on the silicon substrate 10 are formed.

Then, as shown in FIG. 5, a stacked film 20*e* is formed on the silicon substrate 10 by alternately stacking the insulating films 21 made of, for example, silicon oxide and sacrificial films 61 made of, for example, silicon nitride.

Continuing, a resist pattern (not illustrated) is formed on the stacked film 20*e*. The resist pattern is disposed in the region where the stacked body 20 is to be formed. The configuration of the resist pattern when viewed from the Z-direction is a rectangle. Then, the sacrificial film 61 of the uppermost layer and the insulating film 21 of the uppermost layer are selectively removed by performing anisotropic etching such as RIE (Reactive Ion Etching), etc., using the resist pattern as a mask.

Continuing, for example, ashing is performed; and slimming of the resist pattern is performed. Then, one sacrificial film 61 and one insulating film 21 are removed in the region not covered with the resist pattern by performing RIE using the slimmed resist pattern as a mask. Similarly thereafter, the stacked film 20*e* is selectively removed by repeating the slimming of the resist pattern and the RIE using the resist pattern as a mask. By selectively removing the sacrificial film 61 of the lowermost layer and the insulating film 21 of the lowermost layer, the stacked body 20 is formed in which the end portion 20*d* is patterned into a staircase configuration.

At this time, the mark member 41 is exposed in the region where the stacked film 20*e* is removed. Then, by using the mark member 41 as a reference, the position of the end edge 20*a* of the stacked body 20 on the X-direction side is detected for each position in the Y-direction. Specifically, the configuration of the end edge 20*a* in the XY plane can be detected by measuring a distance D(yi) between the mark member 41 and the end edge 20*a* for each position yi in the Y-direction. Similarly, the position of each of the terraces T can be measured by measuring the distance to the level difference formed in each layer of the stacked body 20. The position of each of the terraces T can be measured with particularly high precision by disposing the mark member 41 in a range of, for example, 10 μm or less from the end edge 20*a* of the stacked body 20 on the X-direction side.

Then, as shown in FIG. 2 and FIG. 3, the lower portion of the inter-layer insulating film 55 is formed by depositing, for example, silicon oxide. Then, the upper surface of the stacked body 20 is exposed by performing CMP (Chemical Mechanical Polishing). Then, a memory hole MH that extends in the Z-direction is formed in the central portion 20*c* of the stacked body 20. The memory hole MH pierces the stacked body 20 and reaches the silicon substrate 10. Then, the blocking insulating film (not illustrated), the charge storage film 32, the tunneling insulating film (not illustrated), and the silicon pillar 31 are formed on the inner surface of the memory hole MH. The silicon pillar 31 is connected to the silicon substrate 10. A core member may be formed inside the silicon pillar 31. Then, the insulating member 28 that extends in the X-direction is formed in the upper portion of the central portion 20*c* of the stacked body 20.

Continuing, a slit ST that spreads along the XZ plane is formed in the inter-layer insulating film 55 and the stacked body 20. The slit ST pierces the stacked body 20 in the X-direction and the Z-direction. Thereby, the stacked body 20 is divided into multiple portions along the Y-direction. Although the slit ST pierces the inter-layer insulating film 55 in the Z-direction, the slit ST does not pierce through the inter-layer insulating film 55 in the X-direction. In the embodiment, the slit ST does not reach the region directly above the mark member 41.

Then, the sacrificial films 61 are removed from the stacked body 20 via the slit ST. For example, in the case where the sacrificial films 61 are formed of silicon nitride, wet etching is performed using hot phosphoric acid. Then, the electrode films 22 are formed by filling the spaces where the sacrificial films 61 are removed with a conductive material such as tungsten, etc. Thus, the sacrificial films 61 are replaced with the electrode films 22.

Continuing, the conductive material such as tungsten or the like that is deposited inside the slit ST is removed. Then, an insulating material such as silicon oxide or the like is deposited and removed from the bottom surface of the slit ST. Thereby, the insulating plate 26 is formed on the inner side surface of the slit ST. Then, the conductive plate 25 is formed inside the slit ST by depositing a conductive material such as tungsten, polysilicon, etc. The conductive plate 25 is connected to the silicon substrate 10 and is insulated from the electrode films 22 by the insulating plate 26.

Then, the plugs 58 and the bit lines 57 are formed; and the upper portion of the inter-layer insulating film 55 is formed. Then, the contacts 56 that extend in the Z-direction are formed inside the inter-layer insulating film 55. The lower ends of the contacts 56 are connected to the electrode films 22 at the terraces T. Thus, the semiconductor memory device 1 according to the embodiment is manufactured.

Operations and effects of the embodiment will now be described.

In the embodiment as shown in FIG. 1 to FIG. 5, the mark member 41 is formed inside the silicon substrate 10 and exposed at the upper surface 10*a* of the silicon substrate 10. Thereby, the mark member 41 is exposed when patterning the end portion 20*d* of the stacked body 20 into the staircase configuration. Also, the material of the mark member 41 is a material that is different from the material of the silicon substrate 10. Thereby, the mark member 41 can be identified at the upper surface 10*a* of the silicon substrate 10 by an observation method such as a SEM (Scanning Electron Microscope), etc. As a result, by using the mark member 41 as a reference, the position of the end edge 20*a* of the stacked body 20 on the X-direction side can be measured; and the positions of the terraces T can be measured. The mark member 41 is totally disposed in a region opposing the total length of the end edge 20*a*; therefore, the positions of the terraces T can be measured over the total length of the stacked body 20 in the Y-direction.

In the embodiment, the mark members 41 are formed by utilizing the process of forming the STI inside the peripheral circuit regions 51 and inside the sense amplifier region 52; therefore, a dedicated process for forming the mark members 41 is unnecessary. Therefore, the increase of the manufacturing cost due to the formation of the mark members 41 can be suppressed.

In the embodiment, the mark member 41 is not provided on the Y-direction sides of the stacked body 20. Thereby, the sense amplifier region 52 can be disposed to be proximal to the Y-direction side of the stacked body 20; therefore, downsizing of the semiconductor memory device 1 can be realized. By forming an impurity diffusion region such as a well, etc., below the mark member 41, conduction between the two X-direction sides of the mark member 41 can be ensured.

First Modification of First Embodiment

A first modification of the first embodiment will now be described.

Figure 6:
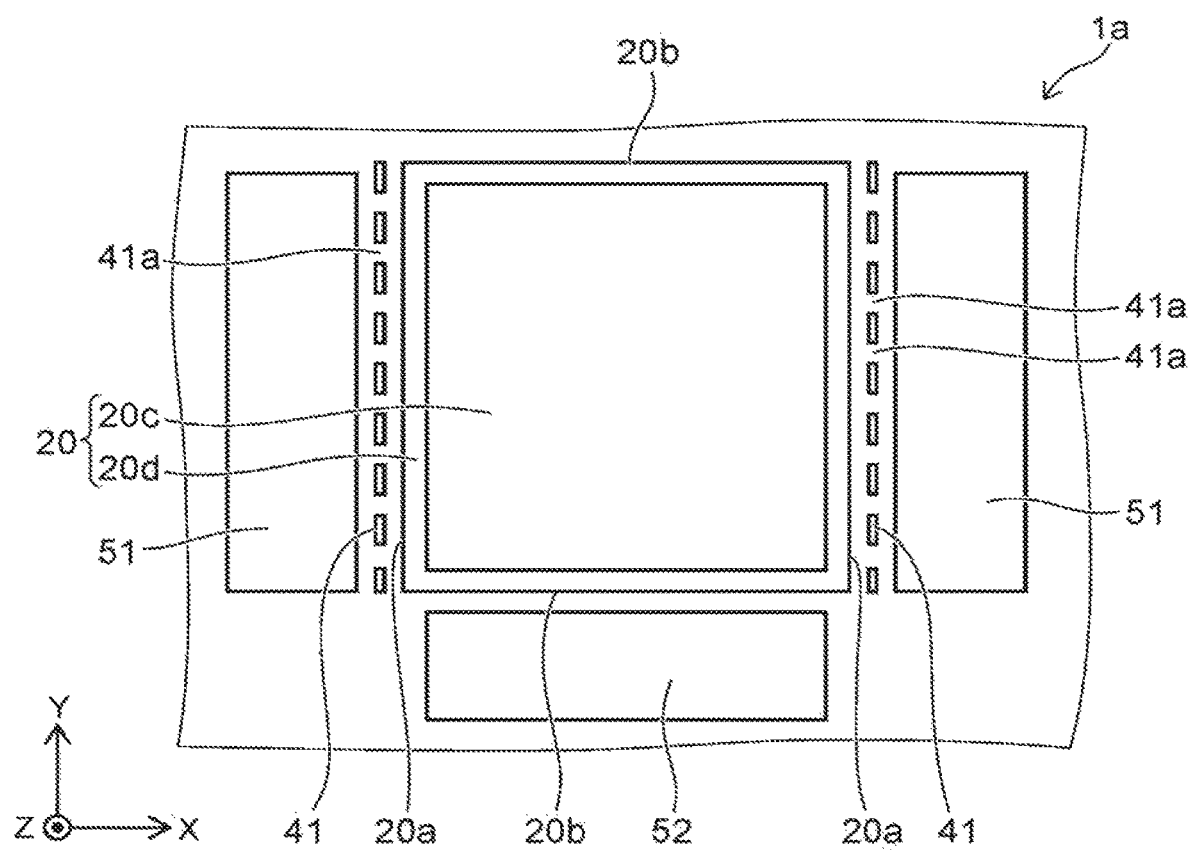
FIG. 6 is a plan view showing a semiconductor memory device according to a first modification of the first embodiment.

FIG. 6 is a plan view showing a semiconductor memory device according to the modification.

Figure 7:
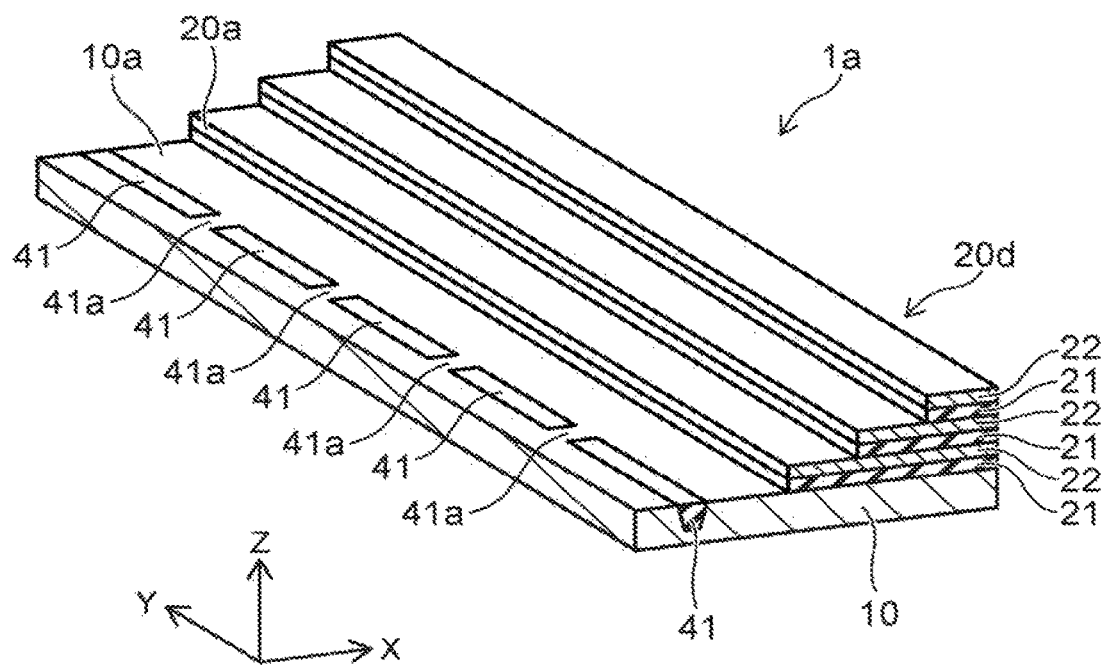
FIG. 7 is a perspective view showing the semiconductor memory device according to the first modification of the first embodiment.

FIG. 7 is a perspective view showing the semiconductor memory device according to the modification.

As shown in FIG. 6 and FIG. 7, the semiconductor memory device 1a according to the modification differs from the semiconductor memory device 1 according to the first embodiment described above (referring to FIG. 1 to FIG. 4) in that the mark member 41 is disposed to be discontinuous along the Y-direction. In other words, divided portions 41a are formed in the mark member 41.

According to the modification, conduction between the two X-direction sides of the mark member 41 can be ensured via the divided portions 41a of the mark member 41 even without forming an impurity diffusion region such as a well, etc., below the mark member 41 because the mark member 41 is disposed to be discontinuous.

Otherwise, the configuration, the manufacturing method, the operations, and the effects of the modification are similar to those of the first embodiment described above.

Second Modification of First Embodiment

A second modification of the first embodiment will now be described.

Figure 8:
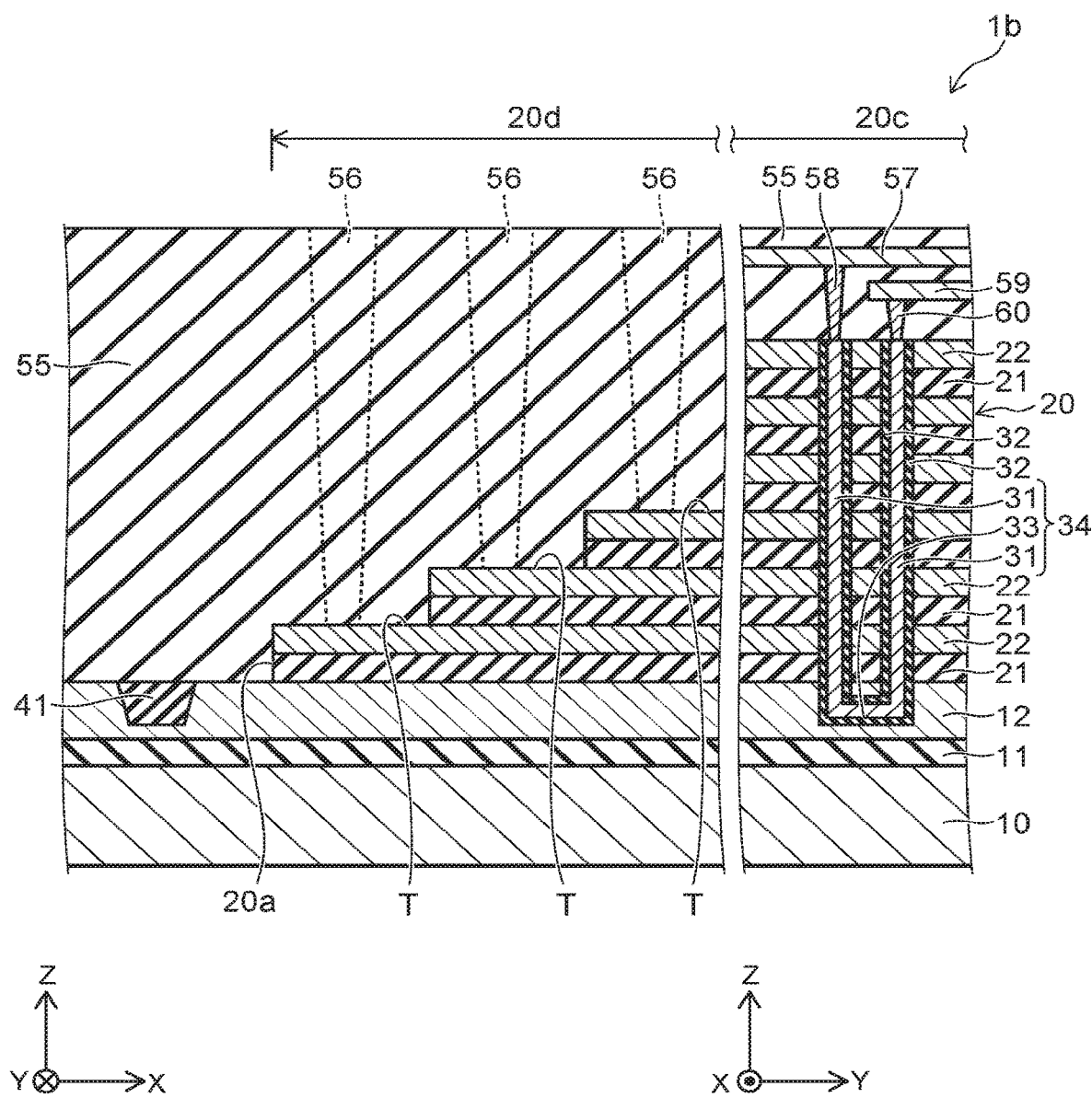
FIG. 8 is a cross-sectional view showing a semiconductor memory device according to a second modification of the first embodiment.

FIG. 8 is a cross-sectional view showing a semiconductor memory device according to the modification.

In the semiconductor memory device 1b according to the modification as shown in FIG. 8, an insulating film 11 that is made of, for example, silicon oxide is provided on the silicon substrate 10. A back gate electrode 12 that is made of, for example, a conductive material such as polysilicon or the like is provided on the insulating film 11. The mark member 41 is formed in the upper layer portion of the back gate electrode 12. A connector member 33 that is made of, for example, polysilicon is provided inside the back gate electrode 12. The silicon pillars 31 do not reach the silicon substrate 10; and the lower ends of the silicon pillars 31 adjacent to each other in the Y-direction are connected to each other via the connector member 33 inside the back gate electrode 12. As a result, a U-shaped semiconductor member 34 is formed as one body from two silicon pillars 31 and one connector member 33. Then, the memory film in which the tunneling insulating film (not illustrated), the charge storage film 32, and the blocking insulating film (not illustrated) are stacked is provided at the periphery of the semiconductor member 34. Thereby, the semiconductor member 34 is insulated from the back gate electrode 12 and the electrode films 22 by the memory film.

One of the two silicon pillars 31 included in the semiconductor member 34 is connected to the bit line 57 via the plug 58; and the other one of the two silicon pillars 31 is connected to a source line 59 via a plug 60. For example, the bit line 57 extends in the Y-direction; and the source line 59 extends in the X-direction.

According to the modification, the manufacturing of the semiconductor memory device 1b is easy because the source line 59 can be disposed above the stacked body 20 in addition to the bit line 57.

Otherwise, the configuration, the manufacturing method, the operations, and the effects of the modification are similar to those of the first embodiment described above.

The mark member 41 may pierce through the back gate electrode 12 in the Z-direction if it is unnecessary to provide conduction in the back gate electrode 12 between the portions disposed on the two sides of the mark member 41. Also, the mark member 41 may be disposed to be discontinuous as in the first modification described above to provide conduction more reliably in the back gate electrode 12 between the portions disposed on the two sides of the mark member 41.

Third Modification of First Embodiment

A third modification of the first embodiment will now be described.

Figure 9:
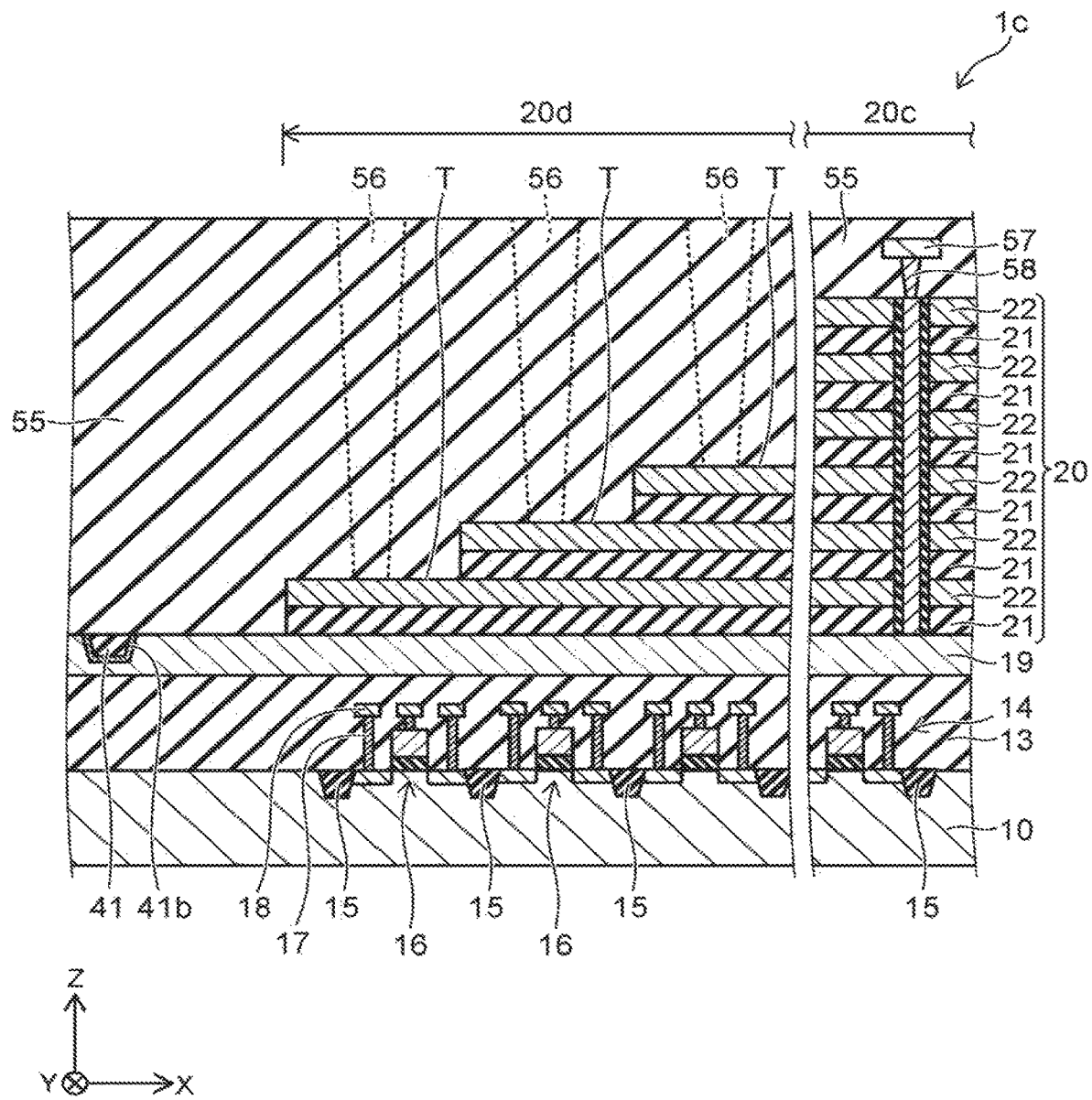
FIG. 9 is a cross-sectional view showing a semiconductor memory device according to a third modification of the first embodiment.

FIG. 9 is a cross-sectional view showing a semiconductor memory device according to the modification.

In the semiconductor memory device 1c according to the modification as shown in FIG. 9, an inter-layer insulating film 13 that is made of, for example, silicon oxide is provided on the silicon substrate 10. A peripheral circuit 14 is formed inside the inter-layer insulating film 13 and the upper layer portion of the silicon substrate 10. MOSFETs (Metal-Oxide-Semiconductor Field-Effect Transistors) 16 are formed inside regions partitioned by, for example, STIs 15 in the peripheral circuit 14. Also, contacts 17 and interconnects 18 are provided inside the inter-layer insulating film 13. Circuit components other than those recited above may be provided in the peripheral circuit 14.

A buried source line 19 that is made of, for example, a conductive material such as tungsten, polysilicon, or the like is provided on the inter-layer insulating film 13. Then, the mark member 41 is formed in the upper layer portion of the buried source line 19. In the case where the buried source line 19 is made of tungsten and the mark member 41 is made of silicon oxide, a barrier metal layer 41b that is made of, for example, titanium nitride (TiN) or the like is provided between the buried source line 19 and the mark member 41.

According to the modification, by providing the peripheral circuit 14 between the silicon substrate 10 and the stacked body 20, the surface area of the peripheral circuit region 51 or the sense amplifier region 52 can be reduced; and downsizing of the semiconductor memory device 1c can be realized. Otherwise, the configuration, the manufacturing method, the operations, and the effects of the modification are similar to those of the first embodiment described above.

The mark member 41 may pierce through the buried source line 19 in the Z-direction. In such a case, the mark member 41 may be formed in the same process as an insulating member (not illustrated) provided in the buried source line 19 for causing through-vias (not illustrated) from above the stacked body 20 to pierce the stacked body 20 and the buried source line 19 and reach the interconnects 18 of the peripheral circuit 14.

Second Embodiment

A second embodiment will now be described.

Figure 10:
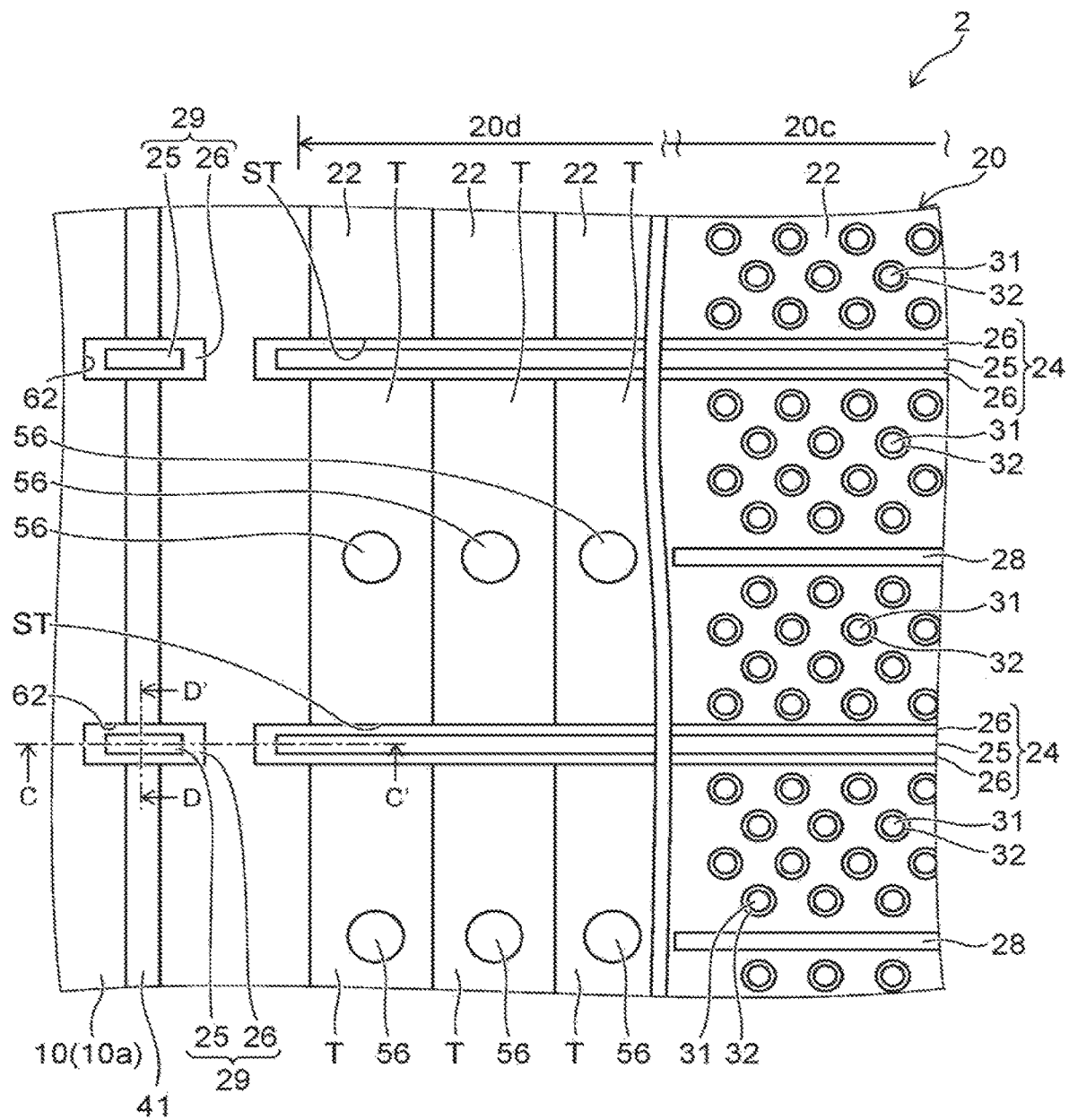
FIG. 10 is a plan view showing a semiconductor memory device according to a second embodiment.

FIG. 10 is a plan view showing a semiconductor memory device according to the embodiment.

Figure 11:
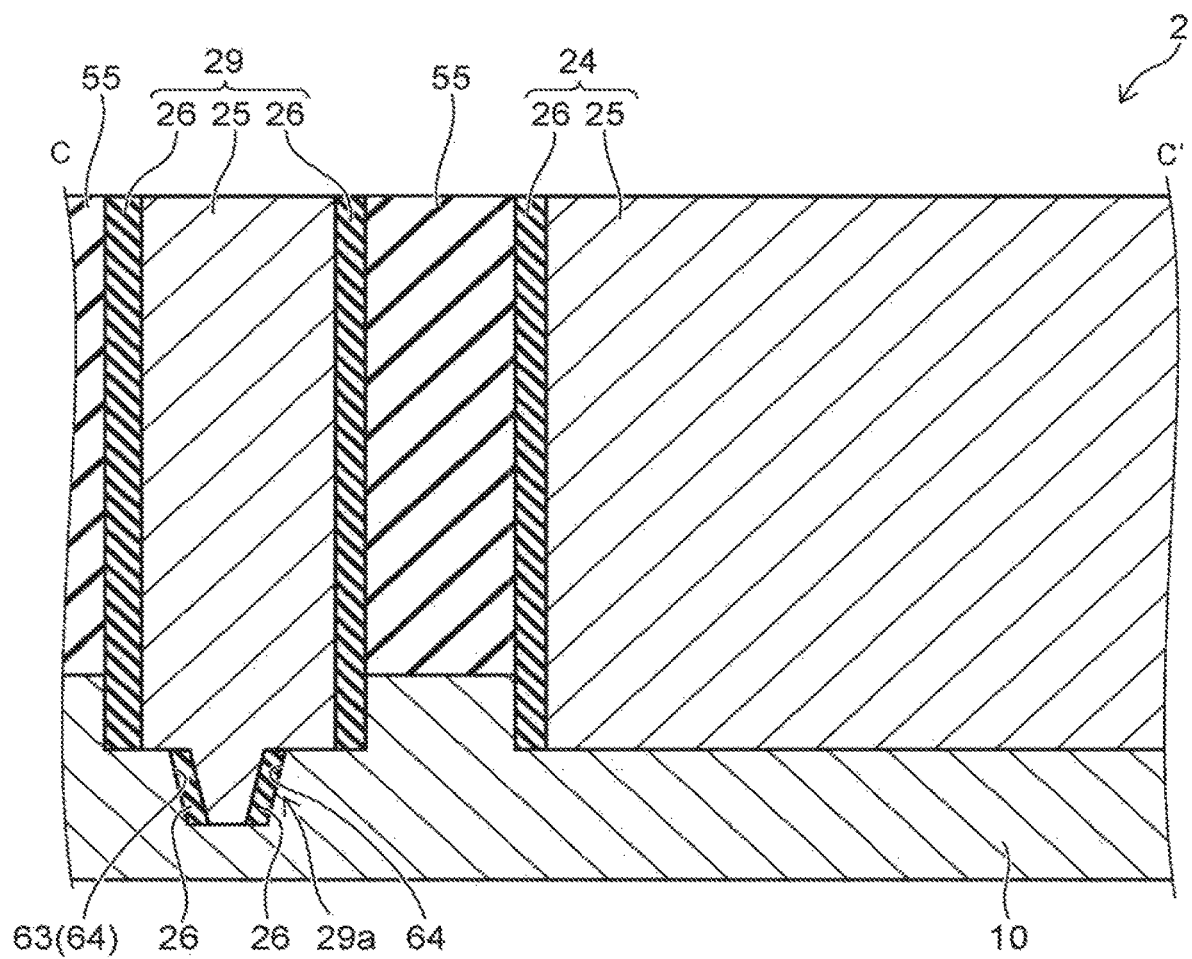
FIG. 11 is a cross-sectional view along line C-C' shown in FIG. 10.

FIG. 11 is a cross-sectional view along line C-C' shown in FIG. 10.

Figure 12:
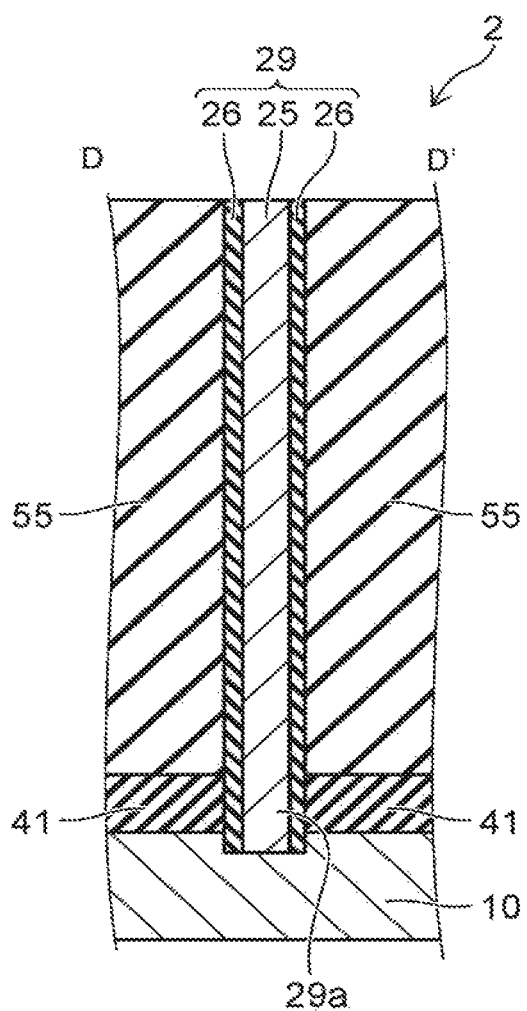
FIG. 12 is a cross-sectional view along line D-D' shown in FIG. 10.

FIG. 12 is a cross-sectional view along line D-D' shown in FIG. 10.

In the semiconductor memory device 2 according to the embodiment as shown in FIG. 10, a plate member 29 is provided in addition to the configuration of the semiconductor memory device 1 according to the first embodiment described above (referring to FIG. 1 to FIG. 4).

The plate member 29 is disposed on an extension line of the plate member 24 along the X-direction at a position interposed between the mark member 41. The plate member 29 pierces the inter-layer insulating film 55 in the Z-direction and contacts the silicon substrate 10. A protrusion 29a is formed at the lower surface of the plate member 29. The protrusion 29a enters the silicon substrate 10 and divides the mark member 41. In other words, the protrusion 29a is the lower end portion of the plate member 29 and is disposed between a pair of mark members 41 adjacent to each other in the Y-direction. The portion of the plate member 29 other than the protrusion 29a is disposed in the region directly above the protrusion 29a and on the two X-direction sides of the region directly above the protrusion 29a.

In the plate member 29, the conductive plate 25 is provided; and the insulating plate 26 is provided at the periphery of the conductive plate 25 when viewed from the Z-direction. As described below, the conductive plate 25 of the plate member 29 is formed by the same process as the conductive plate 25 of the plate member 24 and has substantially the same composition. The insulating plate 26 of the plate member 29 is formed by the same process as the insulating plate 26 of the plate member 24 and has substantially the same composition.

A method for manufacturing the semiconductor memory device 2 according to the embodiment will now be described.

Figure 13:
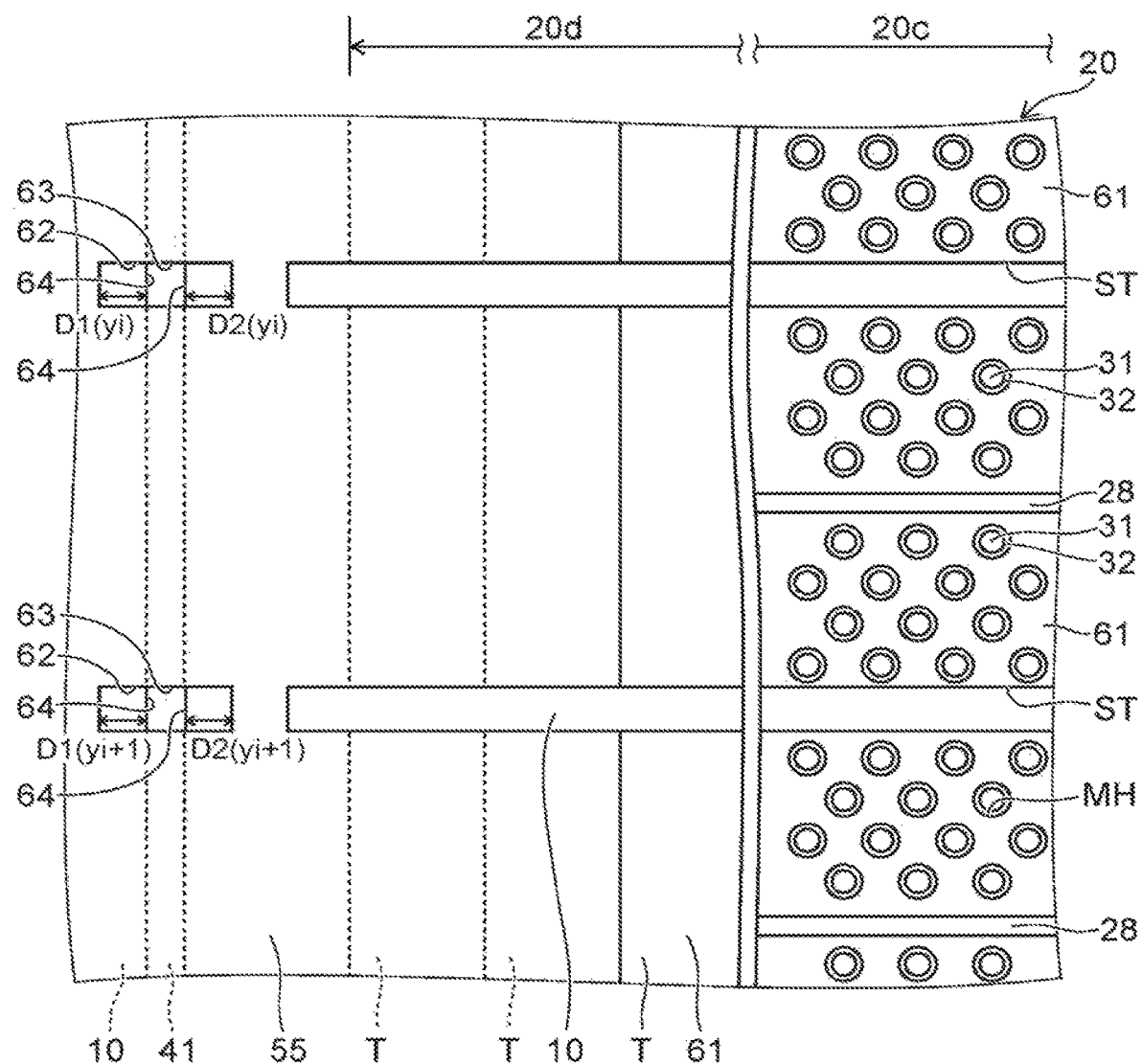
FIG. 13 is a plan view showing a method for manufacturing the semiconductor memory device according to the second embodiment.

FIG. 13 is a plan view showing the method for manufacturing the semiconductor memory device according to the embodiment.

In the method for manufacturing the semiconductor memory device according to the embodiment, the processes of forming the silicon pillar 31 and the charge storage film 32 in the stacked body 20 are similar to those of the first embodiment described above.

Namely, first, as shown in FIG. 5, the mark member 41 is formed in the upper layer portion of the silicon substrate 10. Then, the stacked film 20e is formed on the silicon substrate 10 by alternately stacking the insulating films 21 made of, for example, silicon oxide and the sacrificial films 61 made of, for example, silicon nitride. Then, a resist pattern (not illustrated) is formed in the region where the stacked body 20 is to be formed on the stacked film 20e. Then, the stacked body 20 is formed by patterning the end portion 20d of the stacked film 20e into a staircase configuration by repeating slimming of the resist pattern and RIE using the resist pattern as a mask.

At this time, because the mark member 41 is exposed at the upper surface 10a of the silicon substrate 10, the position of the end edge 20a of the stacked body 20 on the X-direction side is detected for each position in the Y-direction by using the mark member 41 as a reference. Similarly, the positions of the terraces T are measured for each position in the Y-direction by using the mark member 41 as a reference.

Continuing, for example, the lower portion of the inter-layer insulating film 55 (referring to FIG. 11 and FIG. 12) is formed by depositing silicon oxide. Then, the upper surface of the stacked body 20 is exposed by performing CMP.

Then, as shown in FIG. 13, the memory hole MH that extends in the Z-direction is formed in the central portion 20c of the stacked body 20; and the blocking insulating film (not illustrated), the charge storage film 32, the tunneling insulating film (not illustrated), and the silicon pillar 31 are formed on the inner surface of the memory hole MH. Then, the insulating member 28 that extends in the X-direction is formed in the upper portion of the central portion 20c of the stacked body 20.

The subsequent processes are different from those of the first embodiment.

As shown in FIG. 13, the slit ST that extends in the X-direction and the Z-direction and an opening 62 are formed in the inter-layer insulating film 55 and the stacked body 20 by performing RIE of silicon oxide (SiO) and silicon nitride (SiN). The slit ST and the opening 62 are formed using one mask; and the opening 62 is disposed on an extension line of the slit ST along the X-direction at a position straddling the mark member 41.

At this time, similarly to the slit ST, the opening 62 that extends in the Z-direction pierces the inter-layer insulating film 55 in the Z-direction. Thereby, the silicon substrate 10 is exposed at the bottom surfaces of the slit ST and the opening 62. Similarly to the inter-layer insulating film 55, the mark member 41 is formed of silicon oxide; therefore, a portion of the mark member 41 exposed at the bottom surface of the opening 62 is etched and removed; and a recess 63 is formed. Thereby, the mark member 41 is divided by the recess 63. The side surfaces of the recess 63 on the two X-direction sides become level differences 64.

Then, via the opening 62, the distances between the level differences 64 and the side surfaces of the opening 62 on the X-direction sides are measured using an observation method such as, for example, high-acceleration SEM, etc. Specifically, the distances $D1(yi)$ and $D2(yi)$ on the two X-direction sides when viewed from the recess 63 are measured for each position yi in the Y-direction. Thereby, the position in the X-direction of the opening 62 is measured using the recess 63 as a reference. Because the opening 62 and the slit ST have a constant positional relationship, the position of the slit ST can be measured by measuring the position of the opening 62.

Continuing as shown in FIG. 10, the sacrificial films 61 are replaced with the electrode films 22 via the slit ST. Then, the insulating plate 26 is formed on the inner surfaces of the slit ST and the opening 62 by depositing an insulating material and by removing the insulating material that is on the bottom surface of the slit ST and on the bottom surface of the opening 62. Then, the conductive plate 25 is formed inside the slit ST and inside the opening 62 by depositing a conductive material. Thus, the plate member 24 is formed inside the slit ST; and the plate member 29 is formed inside the opening 62. The plate member 29 is disposed also inside the recess 63 and is used to form the protrusion 29a disposed between the pair of mark members 41 adjacent to each other in the Y-direction as shown in FIG. 12.

Continuing, the plugs 58 and the bit lines 57 are formed; and the upper portion of the inter-layer insulating film 55 is formed. Then, the contacts 56 that extend in the Z-direction are formed inside the inter-layer insulating film 55. The lower ends of the contacts 56 are connected to the electrode films 22 at the terraces T. At this time, the positions of the contacts 56 are determined using the position of the plate member 24 as a reference. Thus, the semiconductor memory device 2 according to the embodiment is manufactured.

Operations and effects of the embodiment will now be described.

In the embodiment, by using the mark member 41 as a reference as shown in FIG. 5, the position of the end edge 20a of the stacked body 20 can be measured; and the positions in the X-direction of the terraces T can be measured.

On the other hand, in the embodiment, the recess 63 is formed in the region where the mark member 41 and the opening 62 overlap as shown in FIG. 13. Therefore, by measuring the distances D1(yi) and D2(yi) between the level differences 64 of the recess 63 and the side surfaces of the opening 62 on the X-direction sides, the position of the opening 62 is measured using the mark member 41 as a reference; the position of the slit ST is measured based on the position of the opening 62; accordingly, the position of the plate member 24 is measured. Then, as shown in FIG. 10, the positions in the X-direction of the contacts 56 are determined using the plate member 24 as a reference.

Thus, the positions of the terraces T are measured using the mark member 41 as a reference; and the positions of the plate members 24 and 29 are measured using the mark member 41 as a reference. Because the positions of the contacts 56 can be determined using the plate members 24 and 29 as a reference, the positions of the contacts 56 with respect to the terraces T can be determined with high precision.

Because the mark member 41 is totally disposed in the region opposing the total length of the end edge 20a of the stacked body 20, the positions of the contacts 56 with respect to the terraces T can be determined with high precision over the total length of the stacked body 20 in the Y-direction.

Otherwise, the configuration, the manufacturing method, the operations, and the effects of the embodiment are similar to those of the first embodiment described above.

Modification of second embodiment A modification of the second embodiment will now be described.

Figure 14:
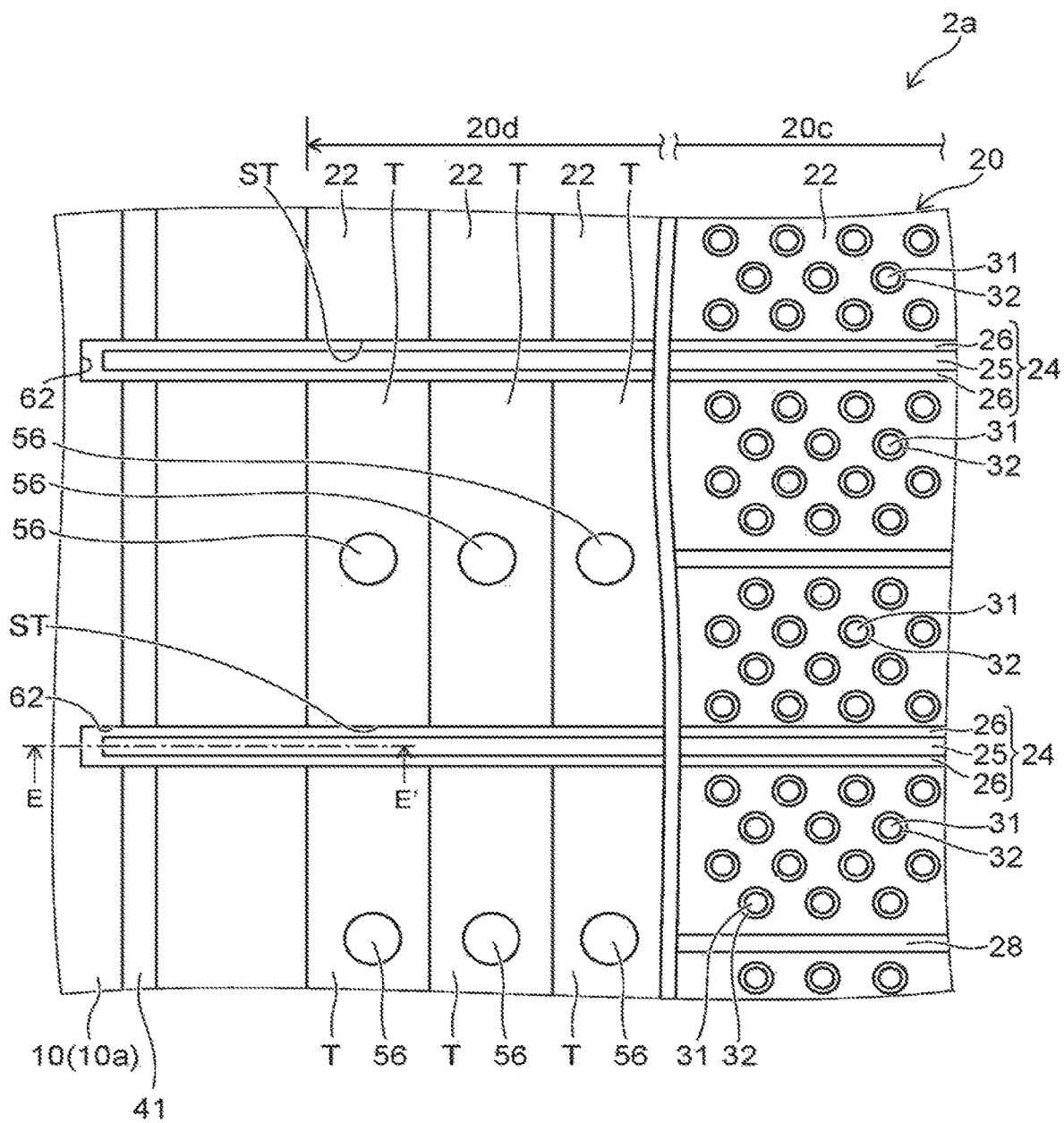
FIG. 14 is a plan view showing a semiconductor memory device according to a modification of the second embodiment.

FIG. 14 is a plan view showing a semiconductor memory device according to the modification.

Figure 15:
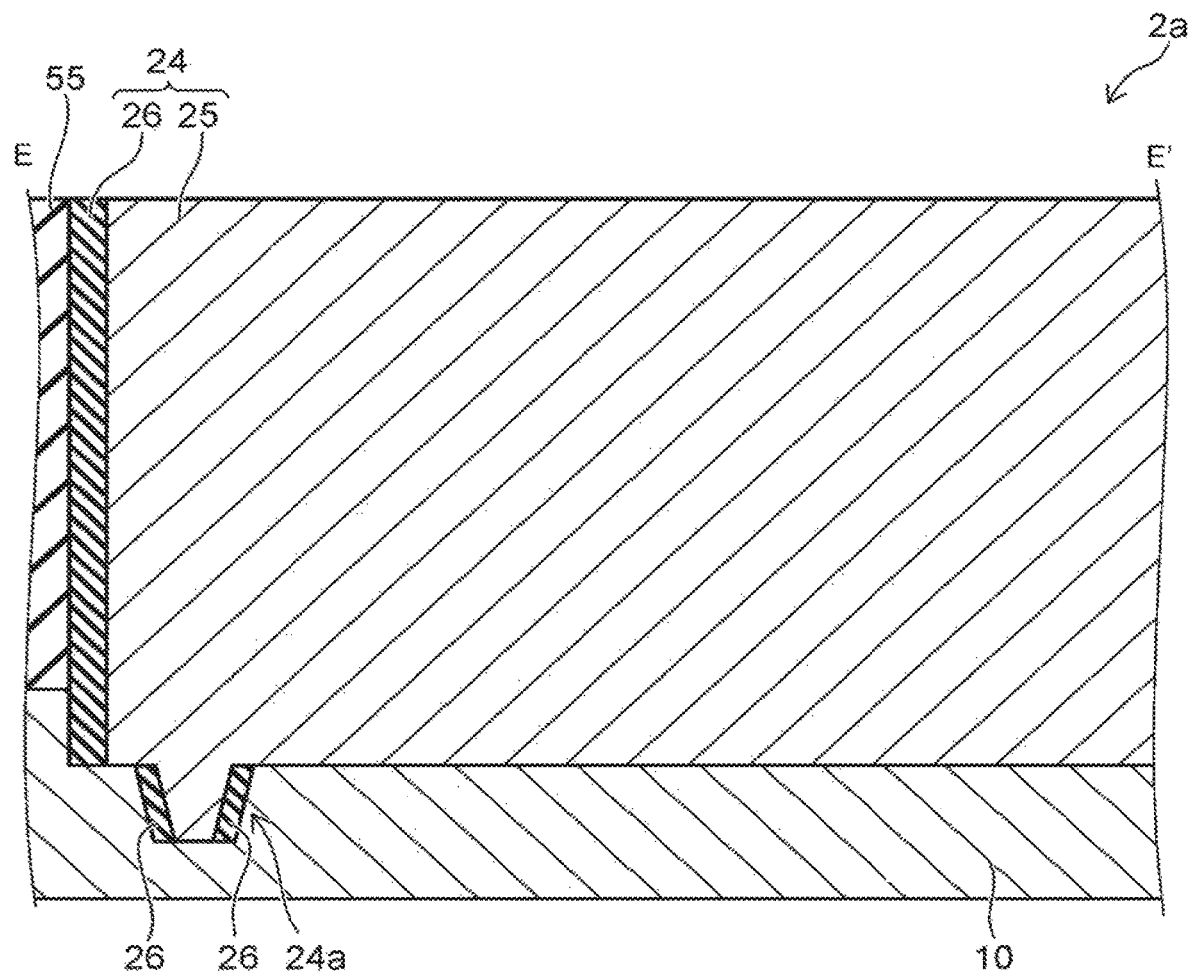
FIG. 15 is a cross-sectional view along line E-E' shown in FIG. 14.
Figure 15:
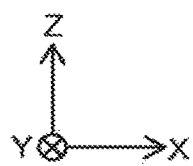

FIG. 15 is a cross-sectional view along line E-E' shown in FIG. 14.

As shown in FIG. 14 and FIG. 15, the semiconductor memory device 2a according to the modification differs from the semiconductor memory device 2 according to the second embodiment described above (referring to FIG. 10 to FIG. 12) in that the plate member 29 is not provided; and the plate member 24 extends to a position dividing the mark member 41. In other words, in the modification, the plate member 29 and the plate member 24 of the second embodiment are formed as one body. A protrusion 24a is formed at the lower surface of the plate member 24. The protrusion 24a is disposed between a pair of mark members 41 adjacent to each other in the Y-direction.

A method for manufacturing the semiconductor memory device according to the modification will now be described.

Figure 16:
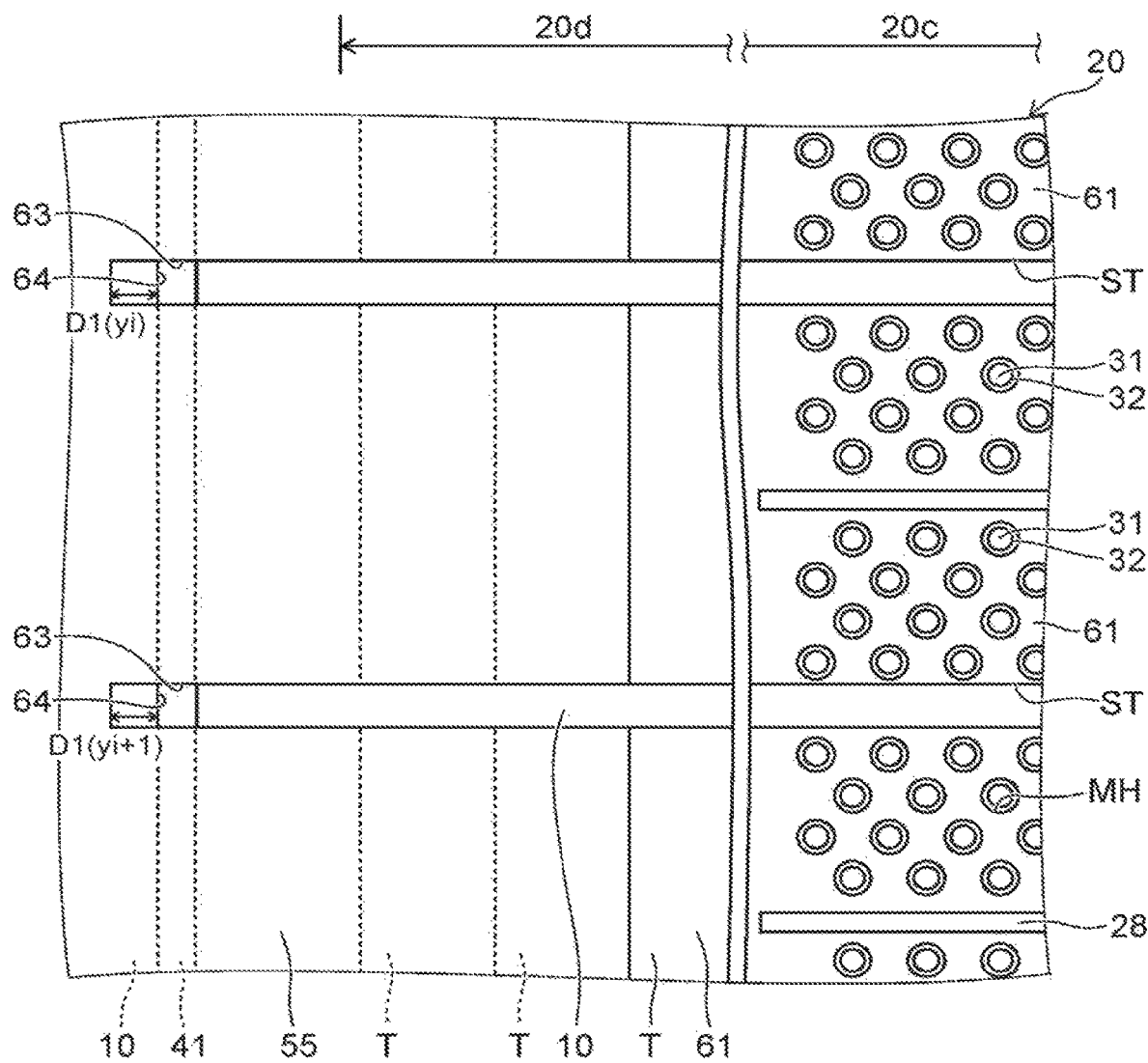
FIG. 16 is a plan view showing a method for manufacturing the semiconductor memory device according to the modification of the second embodiment.

FIG. 16 is a plan view showing the method for manufacturing the semiconductor memory device according to the modification.

When forming the slit ST in the modification as shown in FIG. 16, the slit ST is caused to extend through a region directly above the mark member 41 to a position straddling the mark member 41. Then, the distance D1(yi) between the side surface of the slit ST on the X-direction side and the level difference 64 of the recess 63 on the side distal to the stacked body 20 is measured. Thereby, the position of the slit ST can be measured using the recess 63 as a reference.

Subsequently, the plate member 24 is formed inside the slit ST. At this time, the protrusion 24a is formed inside the recess 63. Thus, the semiconductor memory device 2a according to the modification is manufactured.

Otherwise, the configuration, the manufacturing method, the operations, and the effects of the modification are similar to those of the second embodiment described above.

According to the embodiments described above, a semiconductor memory device can be realized in which the positions of the terraces are detectable.

The embodiments and the modifications of the embodiments described above also can be implemented in combination with each other. For example, in the second embodiment, the mark member 41 may be provided inside the back gate electrode 12 as in the second modification of the first embodiment; and the peripheral circuit 14 may be disposed between the silicon substrate 10 and the stacked body 20 and the mark member 41 may be formed inside the buried source line 19 as in the third modification. Also, in the second embodiment, the mark member 41 may be provided only in a region opposing a portion of the end edge 20a of the stacked body 20.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first member spreading along a first direction and a second direction, the second direction crossing the first direction;
a stacked body provided on a third-direction side when viewed from the first member, the third direction crossing the first direction and the second direction, the stacked body including a plurality of conductive films extending in the first direction, the plurality of conductive films being arranged to be separated from each other along the second direction and the third direction, a configuration of an end portion in the first direction of the stacked body being a staircase configuration having terraces formed every conductive film;
a semiconductor member extending in the third direction and piercing the stacked body;
a charge storage member provided between the semiconductor member and one of the plurality of conductive films; and
a second member provided inside the first member, the second member being exposed at a surface of the first member on the third-direction side further on an outer side than the end portion in the first direction of the stacked body, being made from a material different from a material of the first member, being totally disposed in a region opposing a total length of an end edge of the stacked body on the first-direction side, and not being disposed in an outer region of the stacked body on the second-direction side, wherein the second member includes silicon oxide.

2. The device according to claim 1, wherein the second member extends in the second direction and is disposed to be continuous over the total length of the end edge of the stacked body on the first-direction side.

3. The device according to claim 1, wherein the second member is disposed to be discontinuous along the second direction.

4. The device according to claim 1, wherein
the first member is conductive, and
the second member does not pierce through the first member in the third direction.

5. The device according to claim 1, wherein the first member is a semiconductor substrate.

6. The device according to claim 1, further comprising:
a semiconductor substrate; and
an insulating film provided between the semiconductor substrate and the first member in the third direction, the first member being conductive.

7. The device according to claim 1, wherein a lower end of the semiconductor member is connected to the first member.

8. The device according to claim 1, wherein a lower end of the semiconductor member is disposed inside the first member and insulated from the first member.

9. A semiconductor memory device, comprising:
a first member spreading along a first direction and a second direction, the second direction crossing the first direction;
a stacked body provided on a third-direction side when viewed from the first member, the third direction crossing the first direction and the second direction, the stacked body including a plurality of conductive films extending in the first direction, the plurality of conductive films being arranged to be separated from each other along the second direction and the third direction, a configuration of an end portion in the first direction of the stacked body being a staircase configuration having terraces formed every conductive film;
a semiconductor member extending in the third direction and piercing the stacked body;
a charge storage member provided between the semiconductor member and one of the plurality of conductive films;
a pair of second members provided inside the first member, exposed at a surface of the first member on the third-direction side further on an outer side than the end portion in the first direction of the stacked body, made from a material different from a material of the first member, and arranged along the second direction;
a third member extending in the first direction and the third direction and piercing the stacked body; and
a fourth member extending in the third direction, a protrusion being formed at a lower surface of the fourth member, the protrusion being disposed between the pair of second members.

10. The device according to claim 9, wherein the fourth member includes a component included in the third member.

11. The device according to claim 10, wherein the plurality of conductive films arranged to be separated from each other along the second direction are disposed on both sides of the third member in the second direction.

12. The device according to claim 9, wherein the fourth member is disposed on an extension line of the third member along the first direction.

13. The device according to claim 9, wherein
the first member is conductive, and
the third member includes:
a conductive plate connected to the first member; and
an insulating plate provided between the conductive plate and the plurality of conductive films.

14. The device according to claim 9, wherein
the first member is conductive, and
the second member does not pierce through the first member in the third direction.

15. The device according to claim 9, wherein the first member is a semiconductor substrate.

16. A semiconductor memory device, comprising:
a first member spreading along a first direction and a second direction, the second direction crossing the first direction;
a stacked body provided on a third-direction side when viewed from the first member, the third direction crossing the first direction and the second direction, the stacked body including a plurality of conductive films extending in the first direction, the plurality of conductive films being arranged to be separated from each other along the second direction and the third direction, a configuration of an end portion in the first direction of the stacked body being a staircase configuration having terraces formed every conductive film;
a semiconductor member extending in the third direction and piercing the stacked body;
a charge storage member provided between the semiconductor member and one of the plurality of conductive films;
a pair of second members provided inside the first member, exposed at a surface of the first member on the third-direction side further on an outer side than the end portion in the first direction of the stacked body, made from a material different from a material of the first member, and arranged along the second direction; and
a third member extending in the first direction and the third direction and piercing the stacked body, a protrusion being formed at a lower surface of the third member, the protrusion being disposed between the pair of second members.

17. The device according to claim 16, wherein
the first member is conductive, and
the third member includes:
a conductive plate connected to the first member; and
an insulating plate provided between the conductive plate and the plurality of conductive films.

18. The device according to claim 16, wherein
the first member is conductive, and
the second member does not pierce through the first member in the third direction.

19. The device according to claim 16, wherein the first member is a semiconductor substrate.

* * * * *